US012725665B2

(12) United States Patent
Ahn et al.

(10) Patent No.: US 12,725,665 B2
(45) Date of Patent: Sep. 1, 2026

(54) MEMORY DEVICE CAPABLE OF CHANGING PASS VOLTAGE, MEMORY SYSTEM, AND OPERATING METHOD OF THE MEMORY DEVICE

(71) Applicant: Samsung Electronics Co., Ltd., Suwon-si (KR)

(72) Inventors: Hyojin Ahn, Suwon-si (KR); Seoyeong Lee, Suwon-si (KR); Jungho Lee, Suwon-si (KR); Sungjun Hong, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 29 days.

(21) Appl. No.: 18/753,133

(22) Filed: Jun. 25, 2024

(65) Prior Publication Data

US 2025/0037777 A1 Jan. 30, 2025

(30) Foreign Application Priority Data

Jul. 26, 2023 (KR) ........................ 10-2023-0097801

(51) Int. Cl.

| | |
|---|---|
| ***G11C 16/34*** | (2006.01) |
| ***G11C 11/56*** | (2006.01) |
| ***G11C 13/00*** | (2006.01) |
| ***G11C 16/04*** | (2006.01) |
| ***G11C 16/26*** | (2006.01) |

(52) U.S. Cl.

CPC ...... *G11C 16/3459* (2013.01); *G11C 11/5642* (2013.01); *G11C 13/0033* (2013.01); *G11C 16/0483* (2013.01); *G11C 16/26* (2013.01); *G11C 16/3427* (2013.01)

(58) Field of Classification Search

CPC ............ G11C 16/3459; G11C 11/5642; G11C 13/0033; G11C 16/0483; G11C 16/26; G11C 16/3427; G11C 16/08

See application file for complete search history.

(56) References Cited

U.S. PATENT DOCUMENTS

| | | | | |
|---|---|---|---|---|
| 9,424,933 | B2 | 8/2016 | Choi et al. | |
| 10,120,589 | B2 | 11/2018 | Jung | |
| 10,607,705 | B2 | 3/2020 | Lee et al. | |
| 10,902,924 | B2 | 1/2021 | Park et al. | |
| 11,004,519 | B2 | 5/2021 | Lee et al. | |
| 11,335,423 | B2 | 5/2022 | Cha et al. | |
| 2012/0314499 | A1* | 12/2012 | Yuan | G11C 16/349 365/185.11 |

(Continued)

FOREIGN PATENT DOCUMENTS

| | | |
|---|---|---|
| KR | 102147916 B1 | 8/2020 |

*Primary Examiner* — Donald HB Braswell

(74) *Attorney, Agent, or Firm* — Wolf, Greenfield & Sacks, P.C.

(57) ABSTRACT

According to the inventive concept, a memory device may receive a pass voltage signal set in advance from a host and perform a verification operation with respect to a memory cell array based on the received pass voltage signal. The memory device includes an aggressor word line on which a read operation is performed, and a memory block including a victim word line adjacent to the aggressor word line, and a change in a read voltage with respect to the memory block is recorded and the recorded change in the read voltage is sent to the host.

17 Claims, 14 Drawing Sheets

(56) References Cited

U.S. PATENT DOCUMENTS

2015/0170746 A1* 6/2015 Oowada ................. G11C 16/10
365/185.18
2020/0211653 A1* 7/2020 Chen ................... G06F 11/1048
2022/0180953 A1 6/2022 Na et al.
2024/0347126 A1* 10/2024 Goda ..................... G11C 16/26

* cited by examiner

FIG. 8

| History tR (R7) | −100mV | −200mV | −300mV | −400mV | −500mV |
| --- | --- | --- | --- | --- | --- |
| Vread | −75mV | −175mV | −275mV | −375mV | −450mV |
| Code | 0xFD | 0xF9 | 0xF5 | 0xF1 | 0xFD |

MEMORY DEVICE CAPABLE OF CHANGING PASS VOLTAGE, MEMORY SYSTEM, AND OPERATING METHOD OF THE MEMORY DEVICE

CROSS-REFERENCE TO RELATED APPLICATION

This application is based on and claims priority under 35 U.S.C. § 119 to Korean Patent Application No. 10-2023-0097801, filed on Jul. 26, 2023, in the Korean Intellectual Property Office, the disclosure of which is incorporated by reference herein in its entirety.

BACKGROUND

The inventive concept relates to a memory device capable of changing a pass voltage, a memory system, and an operating method of the memory device, and in particular, to a memory device capable of changing a pass voltage based on a shifting amount of a read voltage, a memory system, and an operating method of the memory device.

Memory devices that have been recently developed may operate according to various specifications. Also, non-volatile memory has been implemented to have a three-dimensional (3D) structure. When read operations are repeatedly performed with respect to non-volatile memory, deterioration of memory cells in the non-volatile memory may occur. In detail, when a read operation is performed with respect to non-volatile memory, a pass voltage (Vread) of a relatively high voltage is applied, and due to repeated read operations, deterioration of memory cells in the non-volatile memory, delays, and/or errors may occur during the reading process.

SUMMARY

The inventive concept provides a memory device capable of preventing deterioration of memory cells due to repeated read operations by changing a pass voltage according to a change in a read voltage when a read operation is performed with respect to non-volatile memory.

According to some embodiments of the inventive concept, a memory device includes a memory cell array including an aggressor word line on which a read operation is performed, and memory blocking including a victim word line that is adjacent to the aggressor word line. The memory device is configured to receive a pass voltage signal that is predetermined from a host and configured to perform a verification operation on the memory cell array based on the pass voltage signal. A change in a read voltage with respect to the memory block is recorded as a recorded change in the read voltage. The recorded change is sent to the host.

According to some embodiments of the inventive concept, provided is an operating method of a memory device configured to receive a pass voltage that is predetermined from a host and configured to perform a verification operation on a memory cell array based on the pass voltage. The operating method includes determining a memory block that is a target of data reading, recording a change in a read voltage of the memory block as a recorded change in the read voltage, and transmitting the recorded change in the read voltage to the host, and changing the pass voltage based on the recorded change in the read voltage.

According to some embodiments of the inventive concept, provided is a memory system including a host configured to transmit a pass voltage signal including a pass voltage that is predetermined, and a memory device configured to receive the pass voltage signal and perform a verification operation on a memory cell array based on the pass voltage signal that was received. The memory device includes an aggressor word line on which a read operation is performed, and a memory block including a victim word line that is adjacent to the aggressor word line. Also, the memory device according to some embodiments is configured to record a change in a read voltage with respect to the memory block as a recorded change and configured to transfer the recorded change in the read voltage to the host.

BRIEF DESCRIPTION OF THE DRAWINGS

Embodiments of the inventive concept will be more clearly understood from the following detailed description taken in conjunction with the accompanying drawings in which:

FIG. 8 is a table for changing a pass voltage according to some embodiments;

DETAILED DESCRIPTION

Hereinafter, one or more embodiments of the present invention will be described below with reference to accompanying drawings. Hereinafter, details such as a detailed configuration and structure are provided to help readers understand embodiments of the inventive concept. Thus, the embodiments described herein may be variously modified or corrected within the scope of the embodiments.

Figure 1:
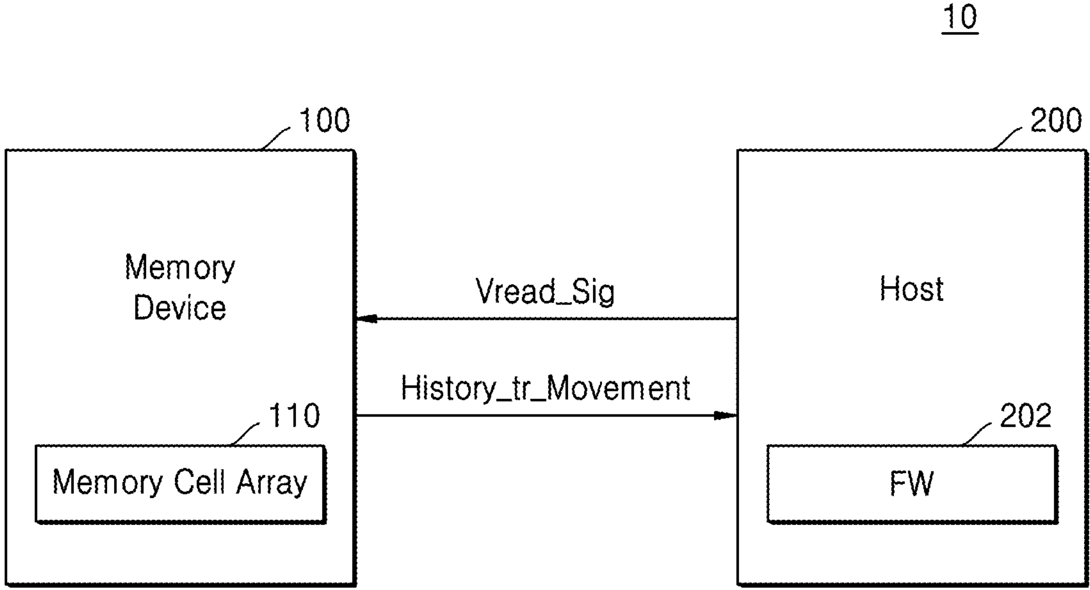
FIG. 1 is a block diagram of a memory system according to some embodiments.

FIG. 1 is a block diagram of a memory system 10 according to some embodiments.

Referring to FIG. 1, the memory system 10 according to some embodiments may include a memory device 100 and a host 200. The memory device 100 according to some embodiments receives a pass voltage signal Vread_Sig from the host 200 and transfers a change in a read voltage History_tr_movement to the host 200.

The memory device 100 includes a memory cell array 110 and may perform a verification operation with respect to the memory cell array 110 based on the pass voltage signal Vread_Sig received from the host 200. For example, the memory device 100 receives the pass voltage signal Vread_Sig that is set in advance from the host 200 and may perform a verification operation with respect to at least one memory block included in the memory cell array 110 based on the pass voltage signal Vread_Sig. In some embodiments, the verification operation may be measuring a read voltage of a memory cell. As a result of performing the verification operation, when it is determined that the read voltage with respect to the memory cell array 110 is changed, the memory device 100 according to some embodiments records the change in the read voltage History_tr_movement with respect to the memory block and may transfer the recorded change in the read voltage History_tr_movement to the host 200. The change in the read voltage History_tr_movement according to some embodiments may denote a shifting or changing amount of the read voltage.

The host 200 includes firmware 202 and may store the change in the read voltage History_tr_movement. For example, the host 200 records the change in the read voltage History_tr_movement in the firmware 202 to update the pass voltage signal Vread_Sig that is transferred to the memory device 100. When the pass voltage signal Vread_Sig is updated, the memory device 100 may update the pass voltage Vread that is used for reading elements of the memory cell array 110. For example, when performing a verification operation on the deteriorated memory cell array 110, the memory device 100 may set the magnitude of the pass voltage Vread to be less than the previous pass voltage. The memory device 100 may derive optimal or suitable read voltage and verification voltage by repeatedly performing the read operation based on the updated pass voltage Vread and transferring, sending, or transmitting the change in the read voltage History_tr_movement to the host 200.

Figure 2A:
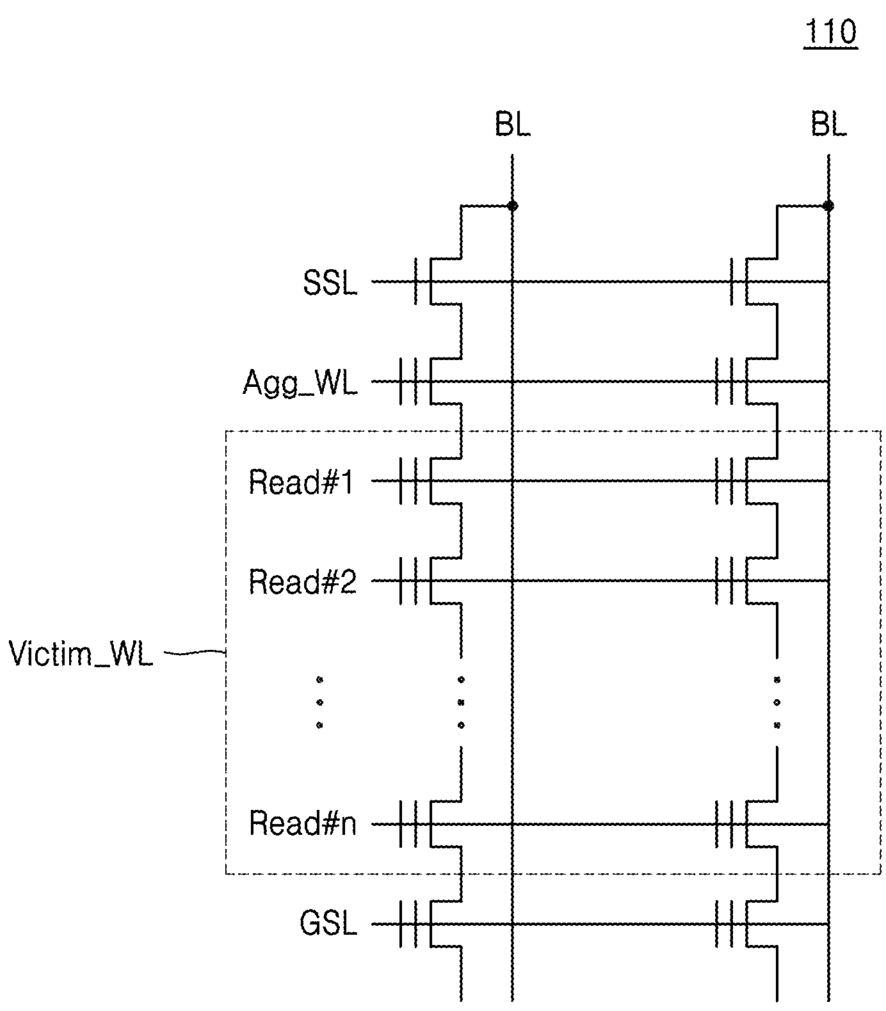
FIG. 2A is a diagram for describing a memory cell array according to some embodiments.

FIG. 2A is a diagram for describing the memory cell array 110 according to some embodiments.

Referring to FIGS. 1 and 2A, the memory cell array 110 may include a plurality of word lines WL, a cell string selection line SSL, a plurality of bit lines BL or a ground selection line GSL.

From among the plurality of word lines, a selected word line that is the target to be verified may be referred to as an aggressor word line Agg_WL. Also, from among the word lines, a non-selected word line that is not the target to be verified may be referred to as a victim word line Victim_WL. For example, the victim word line Victim_WL is not the verification target and may be adjacent to the aggressor word line Agg_WL.

The victim word line Victim_WL may include a plurality of read word lines Read #1, Read #2, . . . , Read #n. Scattering of threshold voltages of the plurality of read word lines Read #1, Read #2, . . . , Read #n may be changed when a verification operation is performed on the aggressor word line Agg_WL. For example, when the verification operation is performed on the aggressor word line Agg_WL, the pass voltage Vread is applied to the victim word line Victim_WL and the victim word line Victim_WL may deteriorate when a duration or the number of times that the pass voltage Vread is applied increases. The memory device 100 may record the change in the read voltage according to the deterioration of the victim word line Victim_WL and change the pass voltage based on the changed read voltage. When the pass voltage is changed, the memory device 100 may maintain the data read operation and prevent the errors that may occur during the data read operation, even with the change in the scattering of the threshold voltages of the word lines due to the deterioration of the victim word line Victim_WL.

The change in the pass voltage Vread according to some embodiments may include offsetting the pass voltage Vread. An offset value of the pass voltage Vread may be set based on Equation 1 below.

[Equation 1]

$$\text{Vread offset value} = \left(\frac{\text{shifting amount in upper end of threshold voltage}}{\text{shifting amount in lower end of threshold voltage}} \times \text{read voltage}\right) \div \text{previous pass voltage}$$

When Equation 1 above is used in calculating the offset value of the pass voltage Vread, a shifting amount of the threshold voltage may be calculated by using a distribution with respect to the memory cell having the largest threshold voltage from among the memory cells. For example, 'shifting amount of the lower end of the threshold voltage' and 'shifting amount of the upper end of the threshold voltage' in Equation 1 above may utilize the shifting amount of the lower end and the shifting amount of the upper end in the distribution of the largest threshold voltage from among the threshold voltages of ones of the memory cells. The lower end of the threshold voltage is a minimum value of the threshold voltage and the upper end of the threshold voltage may be a maximum value of the threshold voltage, of the various memory cells. The memory device 100 may offset the pass voltage Vread by setting the shifting amount of the threshold voltage upper end to be less than the shifting amount of the threshold voltage lower end. For example, a ratio between the shifting amount of the threshold voltage upper end and the shifting amount of the lower end may be set as 0.93:1. The memory device 100 may determine an optimal or suitable offset value of the pass voltage Vread, by calculating the shifting amount of the upper end of the threshold voltage to be less than the shifting amount of the lower end of the threshold voltage.

The offsetting of the pass voltage Vread according to some embodiments may be performed based on a table value set in advance based on Equation 1 above. For example, the memory device 100 may calculate the pass voltage Vread that is to be changed or adjusted according to the deterioration of the memory cell array 110 in advance and store the calculated value as a table value, and then, may offset the pass voltage Vread.

The offsetting of the pass voltage Vread according to some embodiments may be performed provided that a preset condition is satisfied. The preset condition according to some embodiments may denote whether a certain duration has passed or whether the certain number of read operation has exceeded. For example, when the preset duration has passed, the memory device 100 may change the pass voltage Vread based on the change in the read voltage History_tr_movement. In another example, when the preset number of read operations has exceeded, the memory device 100 may change the pass voltage Vread based on the change in the read voltage History_tr_movement.

The offsetting of the pass voltage Vread according to some embodiments may be independently performed on each of a plurality of word lines in the memory cell array 110. For example, the memory device 100 may perform a verification operation for every word line in the memory cell array 110, and update the change in the read voltage to determine the optimal pass voltage Vread with respect to each of the word lines.

Figure 2B:
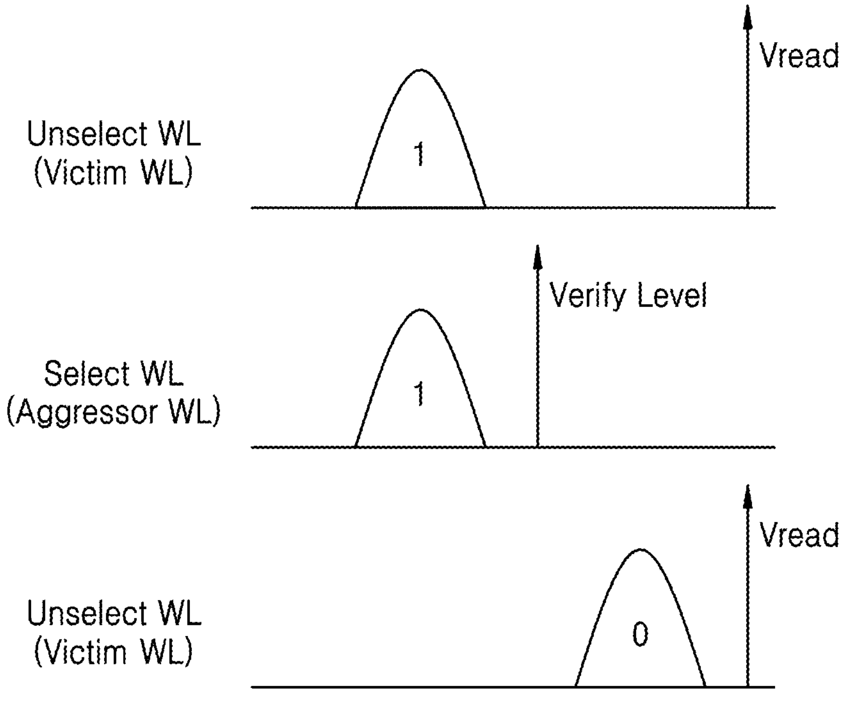
FIG. 2B is a diagram for describing a pass voltage and a verification voltage with respect to a memory cell array according to some embodiments.

FIG. 2B is a diagram for describing a pass voltage and a verification voltage with respect to a memory cell array according to some embodiments.

Referring to FIG. 2B, when performing the read operation, the memory device 100 may perform the verification operation by using a verification voltage (verify level, verify voltage level, or verify voltage) to the selected word line Select WL, and may apply the pass voltage Vread with respect to non-selected word line Unselect WL. The aggressor word line Agg_WL may be the selected word line Select WL on which the verification operation is performed. Also, the victim word line Victim_WL may be the non-selected word line Unselect WL to which the pass voltage Vread is applied. The data value (1 or 0) shown in FIG. 2B is an arbitrary example value for describing the embodiments herein, and the data value may be stored differently for every word line.

The pass voltage Vread may be determined based on a threshold voltage of the word line having the largest threshold voltage. For example, in the example shown in FIG. 2B, a second read word line Read #2 may be a word line having the largest threshold voltage. The memory device 100 may determine the pass voltage Vread based on the maximum value in the distribution of the threshold voltage of the word line that has the largest threshold voltage from among the plurality of word lines.

The memory device 100 performs a pass voltage offset operation in which the pass voltage Vread is determined based on the maximum value in the distribution of the threshold voltage of the word line that has the largest threshold voltage from among the plurality of word lines, and thus, a rapid read operation may be performed even when the non-selected word lines deteriorate.

Figure 3:
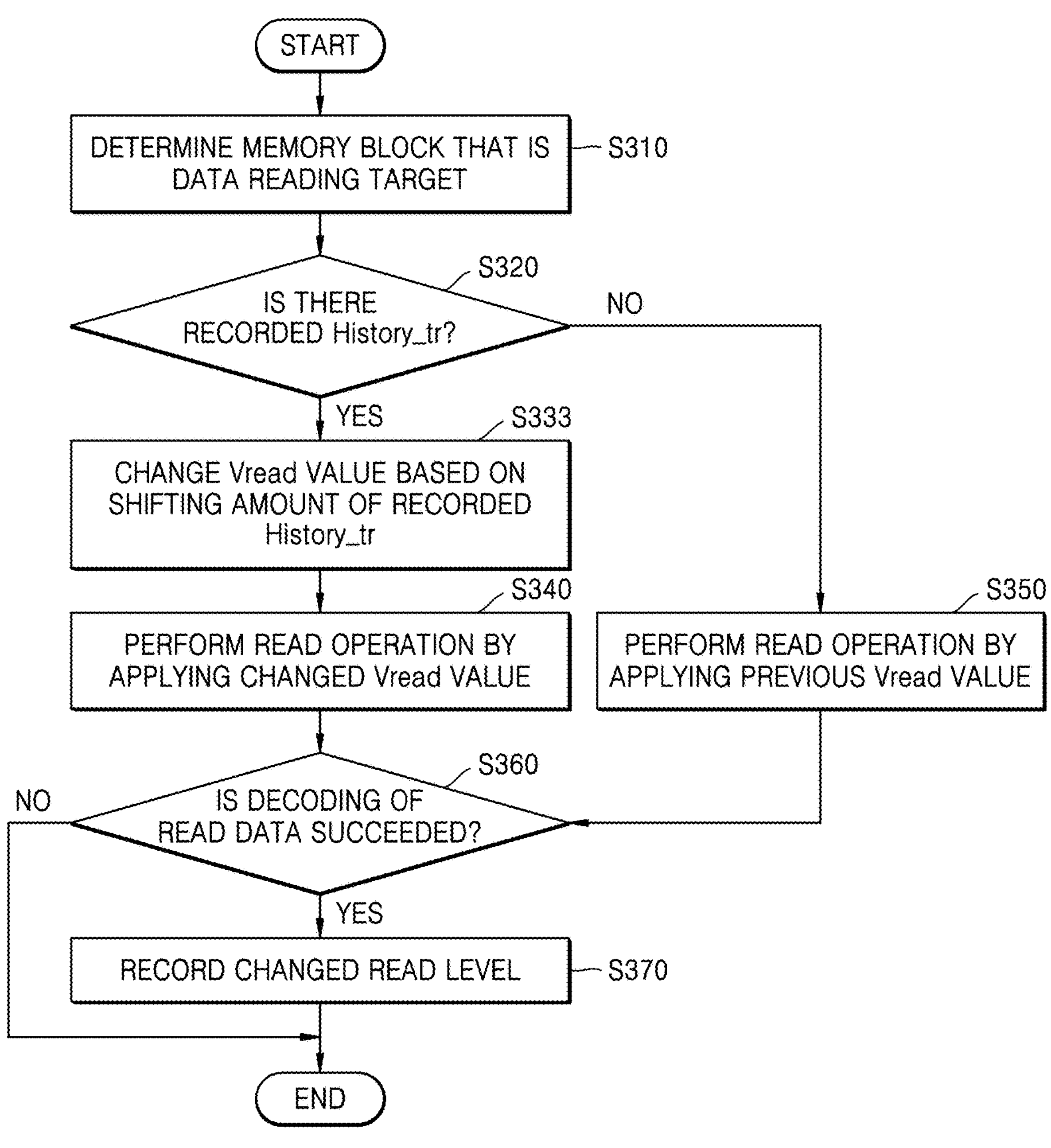
FIG. 3 is a flowchart for illustrating an operating method of a memory device according to some embodiments.

FIG. 3 is a flowchart for illustrating an operating method of a memory device 100 according to some embodiments.

Referring to FIGS. 1 and 3, the memory device 100 may determine a memory block that is a data reading target (S310). The memory block may be a part of the memory cell array 110 of FIG. 1. For example, the memory block may be a unit forming the memory cell array 110.

After the memory block that is the data reading target is determined, the memory device 100 may determine whether there is a recorded read voltage History_tr (S320). The read voltage History_tr according to some embodiments may be a voltage applied in a previous read operation.

When there is recorded read voltage History_tr, the memory device 100 may change a value of the pass voltage Vread based on the shifting amount of the recorded read voltage History_tr (S330). The change in the read voltage History_tr_movement may denote a shifting amount of the read voltage or a difference in the read voltage. The memory device 100 records the change in the read voltage History_tr_movement with respect to the memory block, and may be configured to transmit the recorded change in the read voltage History_tr_movement to a host 200. When the change in the read voltage History_tr_movement is transmitted to the host 200, the host 200 may update the pass voltage signal Vread_Sig for determining the pass voltage Vread, and the memory device 100 may receive the updated pass voltage signal Vread_Sig and change the pass voltage Vread.

The change in the pass voltage Vread may include offsetting the pass voltage Vread. A compensation value of the pass voltage Vread may be set based on Equation 1 above. The offsetting of the pass voltage Vread may be performed based on a table value set in advance or predetermined based on Equation 1 above. For example, the memory device 100 may calculate the pass voltage Vread that is to be changed according to the deterioration of the memory cell array 110 in advance and store the calculated value as a table value, and then, may offset the pass voltage Vread.

When the pass voltage Vread is changed, the memory device 100 may perform the read operation by applying the changed pass voltage Vread (S340).

However, when there is no recorded read voltage History_tr, the memory device 100 may perform the read operation by applying the existing pass voltage Vread (S350).

When the read operation is performed, the memory device 100 may determine whether a decoding of read data has succeeded (S360). When the decoding of the read data has succeeded, the memory device 100 may determine that the read operation performed based on the changed pass voltage Vread is successful.

When it is determined that the decoding of the read data has succeeded, the memory device 100 may record the changed read level (S370). For example, when the decoding of the read data is successful, the memory device 100 determines that the read operation performed based on the changed pass voltage Vread has succeeded, and records the changed pass voltage Vread.

However, when the decoding of the read data fails, the memory device 100 may terminate the read operation without recording the changed read level.

Figure 4A:
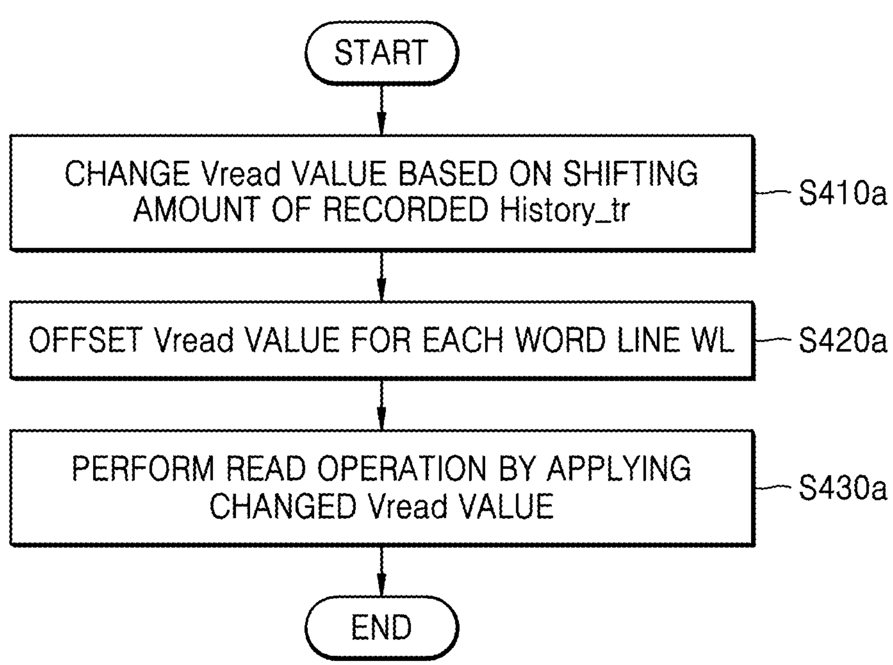
FIGS. 4A and 4B are flowcharts for describing a change in a pass voltage according to some embodiments.
Figure 4B:
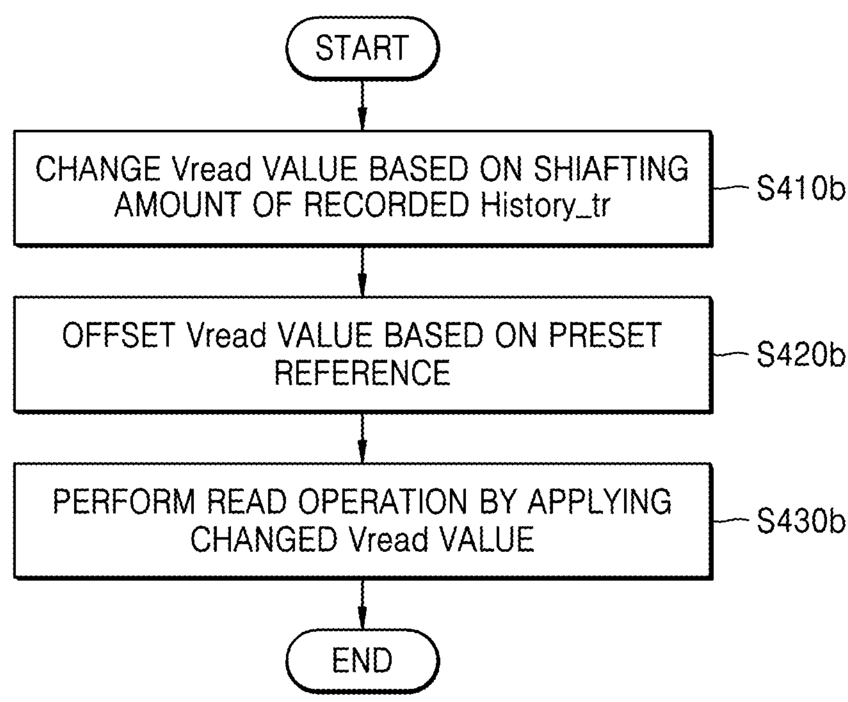

FIGS. 4A and 4B are flowcharts for describing a change in a pass voltage according to some embodiments.

Referring to FIGS. 1 and 4A, the memory device 100 may change the value of the pass voltage Vread based on the shifting amount of the recorded read voltage History_tr (S410*a*).

The change in the read voltage History_tr_movement may denote a shifting amount of the read voltage or difference of the read voltage compared to a previous read voltage. The memory device 100 records the change in the read voltage History_tr_movement with respect to the memory block, and may be configured to transmit the recorded change of the read voltage History_tr_movement to a host 200. When the change in the read voltage History_tr_movement is transmitted to the host 200, the host 200 may update the pass voltage signal Vread_Sig for determining the pass voltage Vread, and the memory device 100 may receive the updated pass voltage signal Vread_Sig and change the pass voltage Vread.

When the voltage of the pass voltage Vread is changed, the memory device 100 may offset the value of the pass voltage Vread for each word line WL (S420*a*).

The offsetting of the pass voltage Vread according to some embodiments may be independently performed on each of a plurality of word lines in the memory cell array 110. For example, the memory device 100 may perform a verification operation for every word line in the memory cell array 110, and update the change in the read voltage to determine the optimal pass voltage Vread with respect to each of the word lines.

When the value of the pass voltage Vread is changed for each word line WL, the memory device 100 may perform the read operation by applying the changed value of the pass voltage Vread (S430*a*).

Referring to FIGS. 1 and 4B, the memory device 100 may change the value of the pass voltage Vread based on the shifting amount of the recorded read voltage History_tr (S410*b*).

The change in the read voltage History_tr_movement may denote a shifting amount of the read voltage. The memory device 100 records the change in the read voltage History_tr_movement with respect to the memory block, and may be configured to transmit the recorded change of the read voltage History_tr_movement to a host 200. When the change in the read voltage History_tr_movement is transmitted to the host 200, the host 200 may update the pass voltage signal Vread_Sig for determining the pass voltage Vread, and the memory device 100 may receive the updated pass voltage signal Vread_Sig and change the pass voltage Vread.

When the voltage of the pass voltage Vread is changed, the memory device 100 may compensate for the value of the pass voltage Vread based on a preset reference (S420*b*).

The preset reference according to some embodiments may denote Equation 1 above stored in the memory device 100. For example, the offset value of the pass voltage Vread may be determined based on Equation 1 set in advance (i.e. predetermined). The present reference may denote a table value set in advance based on Equation 1 above. For example, the offsetting of the pass voltage Vread may be performed based on a table value set in advance based on Equation 1 above. The preset reference may include the number of times performing read operations or a preset duration of time, but is not limited thereto.

When the value of the pass voltage Vread is changed for each word line WL, the memory device 100 may perform the read operation by applying the changed value of the pass voltage Vread (S 430*b*).

Figure 5:
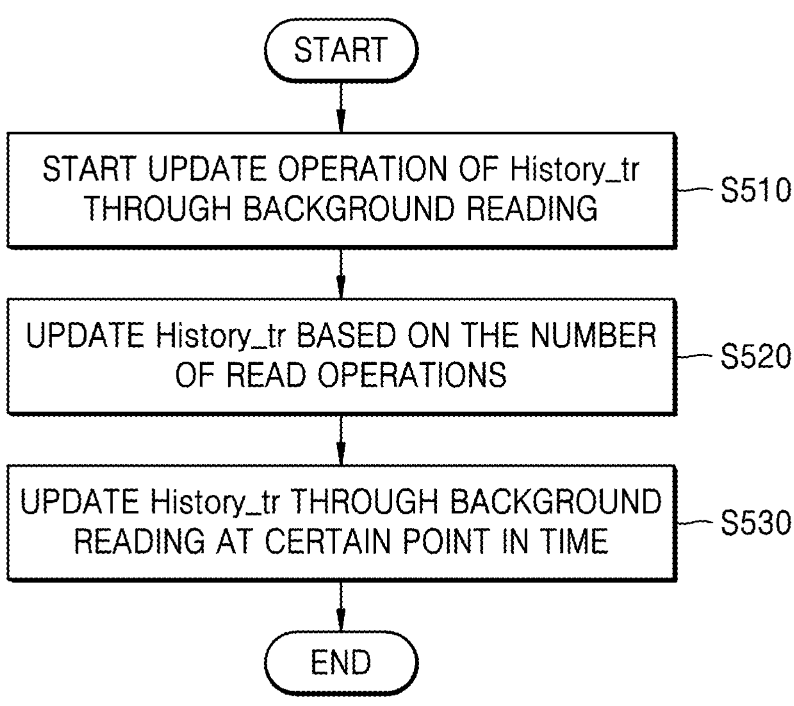
FIG. 5 is a flowchart for describing updating of a read voltage according to some embodiments.

FIG. 5 is a flowchart for describing updating of a read voltage History_tr according to some embodiments.

Referring to FIGS. 1 and 5, the memory device 100 may perform an update operation with respect to the referring to History_tr through a background reading (S510).

The background read operation may include a read operation performed to update the read voltage History_tr. For example, the memory device 100 may perform the read operation at a preset point of time in order to determine whether the read voltage History_tr is changed according to the deterioration of the memory cell array 110. When it is determined that the read operation is not properly performed due to the existing read voltage History_tr, the memory device 100 may perform an update operation with respect to the read voltage History_tr.

When the update operation is performed with respect to the read voltage History_tr, the memory device 100 may update the read voltage History_tr based on the number of performing the read operations (S520). For example, when it is determined that the number of performing the read operations exceeds the preset number, the memory device 100 may determine that the memory cell array 110 is deteriorated and may update the read voltage History_tr.

Also, the memory device 100 may perform the update operation with respect to the read voltage History_tr through the background reading at a certain point in time (S530). For example, when a preset duration has passed, the memory device 100 may determine that the memory cell array 110 is deteriorated and may update the read voltage History_tr.

Figure 6:
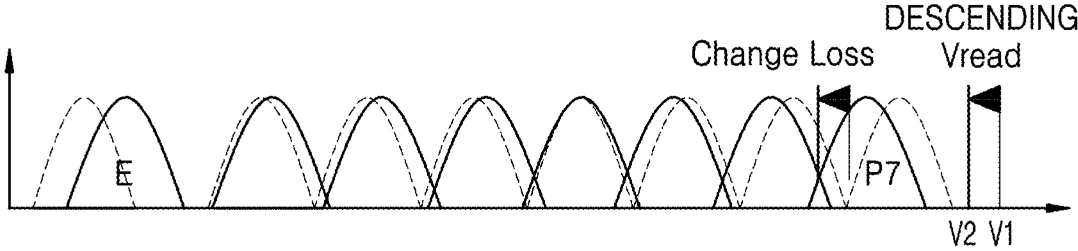
FIG. 6 is a scatter diagram for describing a change in a pass voltage according to some embodiments.

FIG. 6 is a scatter diagram for describing a change in a pass voltage Vread according to some embodiments.

Referring to FIG. 6, X-axis may denote a voltage level or voltage and Y-axis may denote an amount of charges stored in a memory cell. A plurality of memory cells may each have a unique threshold voltage and a unique charge amount E. Hereinafter, an example in which the pass voltage Vread is changed according to the threshold voltage distribution of a memory cell P7 having the maximum threshold voltage value is described.

When the read operation is performed, the memory cell P7 having the maximum threshold voltage value may have a charge loss effect that occurs due to the pass voltage Vread applied to a non-selected word line. According to some embodiments, the value of the pass voltage Vread may be V1. However, when the charge loss occurs, the value of the previous pass voltage Vread may be changed to have a value V2 based on the charge loss ratio. V2 is less than V1 due to deterioration of the memory cell P7.

Figure 7:
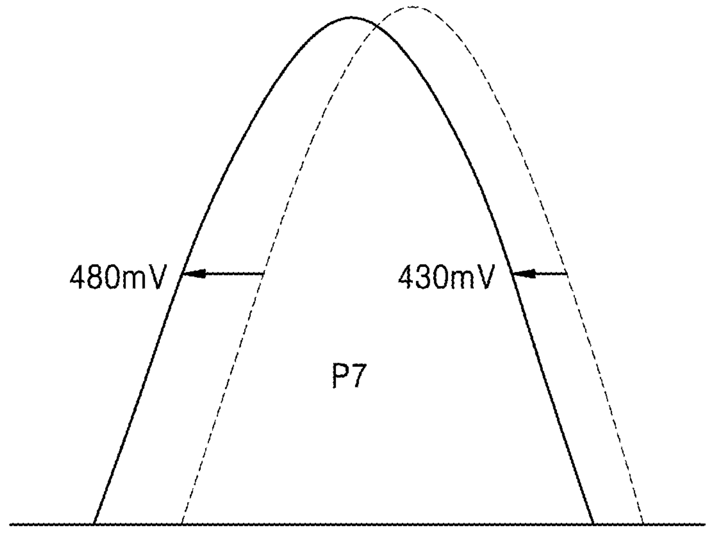
FIG. 7 is a scatter diagram for describing a read voltage change with respect to a memory cell having a highest threshold voltage distribution according to some embodiments.

FIG. 7 is a scatter diagram for describing a read voltage change with respect to a memory cell having a highest threshold voltage distribution according to some embodiments.

Referring to FIGS. 6 and 7, in the memory cell P7 having the maximum threshold voltage value, a ratio between the shifting amount of the upper end of the threshold voltage and the shifting amount of the lower end of the threshold voltage may be set as 0.93:1. For example, the lower end of the threshold voltage may be shifted by about 480 mV and the upper end of the threshold voltage may be shifted by about 430 mV. The memory device 100 may determine an optimal or near optimal compensation value for the pass voltage Vread, by calculating the shifting amount of the upper end of the threshold voltage to be less than the shifting amount of the lower end of the threshold voltage. However, the shifting amount of the lower end and upper end of the threshold voltage is not limited to the above example, the shifting amount may have a different value in each memory cell.

FIG. 8 is a table for changing a pass voltage according to some embodiments.

Hereinafter, the example of FIG. 8 is described based on a read voltage History_tr (R7) of the memory cell having the maximum threshold voltage value. The pass voltage Vread according to the read voltage History_tr (R7) of the memory cell having the maximum threshold voltage value may be set in advance based on Equation 1 above.

For example, when the read voltage History_tr (R7) is −100 mV, the pass voltage Vread may be −75 mV, and in this case, the pass voltage signal Vread_Sig of FIG. 1 may be 0×FD. For example, when the read voltage History_tr (R7) is −200 mV, the pass voltage Vread may be −175 mV, and in this case, the pass voltage signal Vread_Sig of FIG. 1 may be 0×F9. For example, when the read voltage History_tr (R7) is −300 mV, the pass voltage Vread may be −275 mV, and in this case, the pass voltage signal Vread_Sig of FIG. 1 may be 0×F5. For example, when the read voltage History_tr (R7) is −400 mV, the pass voltage Vread may be −375 mV, and in this case, the pass voltage signal Vread_Sig of FIG. 1 may be 0×F1. For example, when the read voltage History_tr (R7) is −500 mV, the pass voltage Vread may be −475 mV, and in this case, the pass voltage signal Vread_Sig of FIG. 1 may be 0×ED. However, the embodiments according to the inventive concept are not limited to the table value shown in FIG. 8, and the pass voltage Vread may be updated based on various table values.

Figure 9:
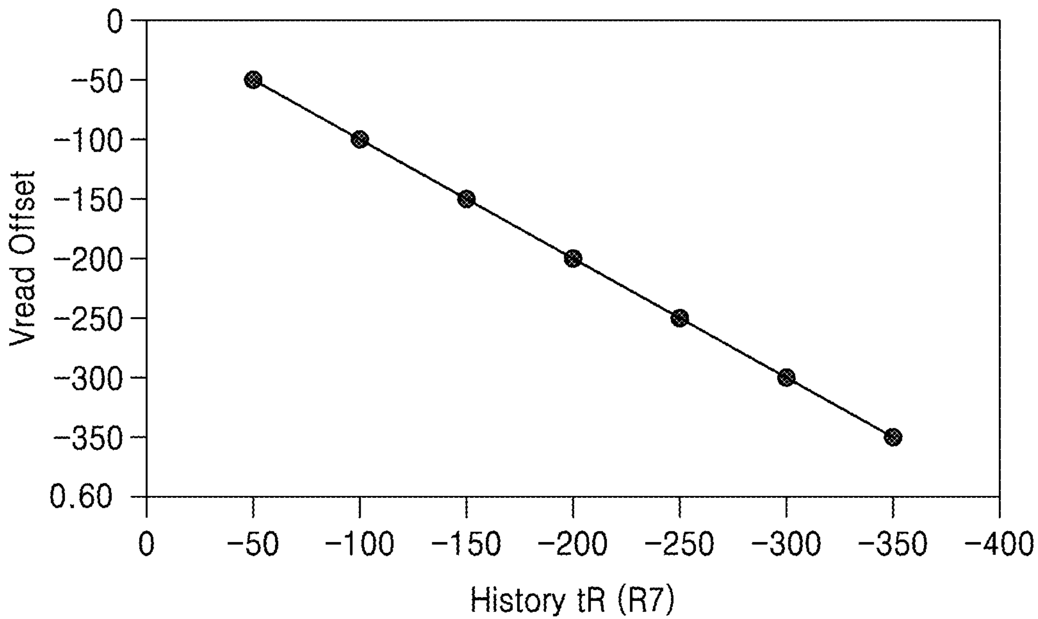
FIG. 9 is a graph for describing a relationship between a pass voltage and a read voltage according to some embodiments.

FIG. 9 is a graph for describing a relationship between a pass voltage and a read voltage according to an embodiment.

In the graph of FIG. 9, X-axis may denote a value of the read voltage History_tr (R7) of the memory cell having the maximum threshold value voltage, and Y-axis may denote an offset value of the pass voltage (Vread offset). Referring to FIG. 9, when an absolute value of a variation amount of the read voltage History_tr (R7) of the memory cell having the maximum threshold voltage value increases, an absolute value of the offset value of the pass voltage (Vread offset) tends to increase. For example, when the shifting amount of the read voltage History_tr (R7) value of the memory having the largest threshold voltage value is large, the memory device 100 may offset the pass voltage by increasing the offset value of the pass voltage (Vread offset).

Figure 10:
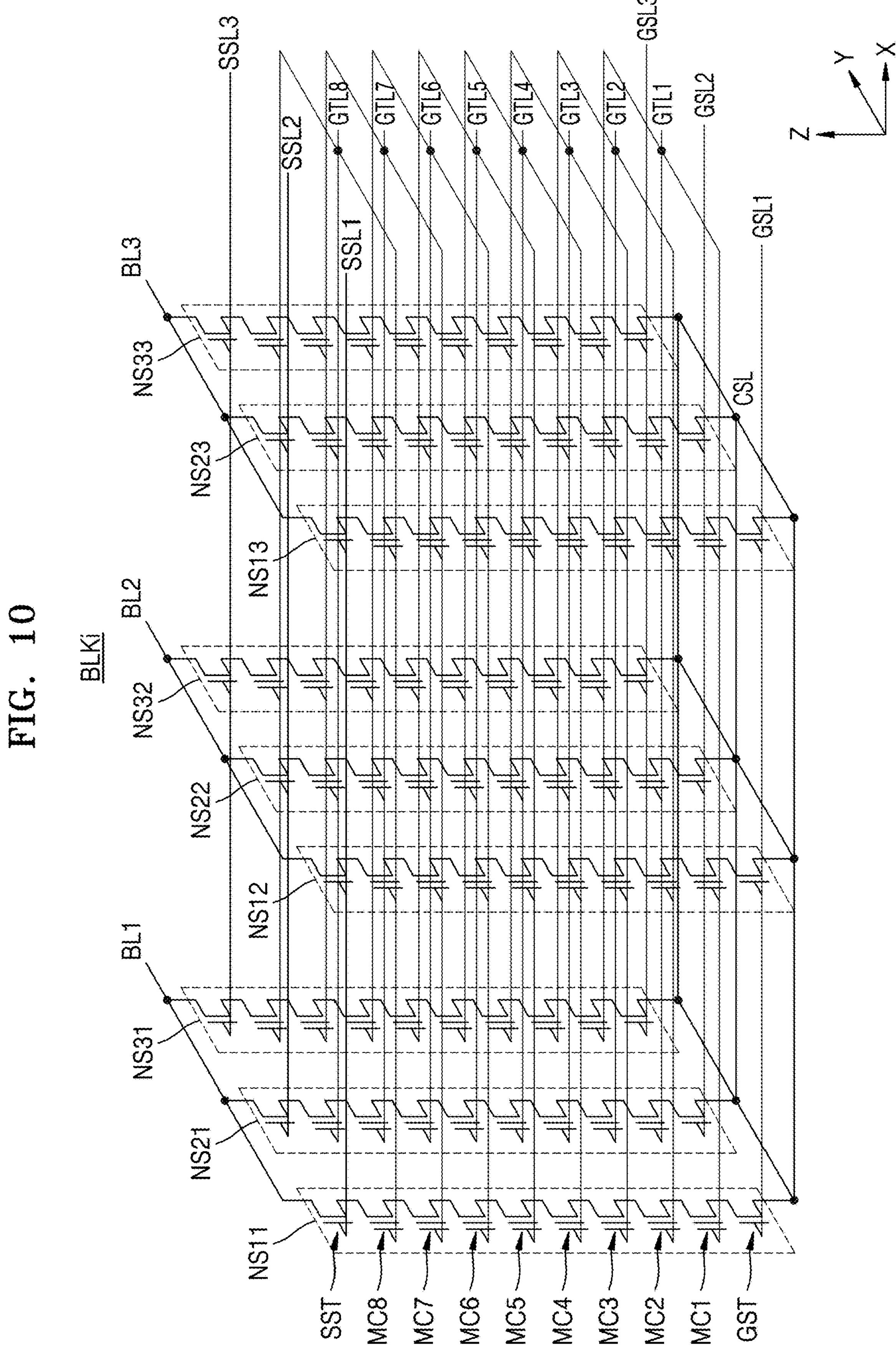
FIGS. 10 to 12 are diagrams for describing a 3D V-NAND structure that may be applied to a memory device according to some embodiments.
Figure 11:
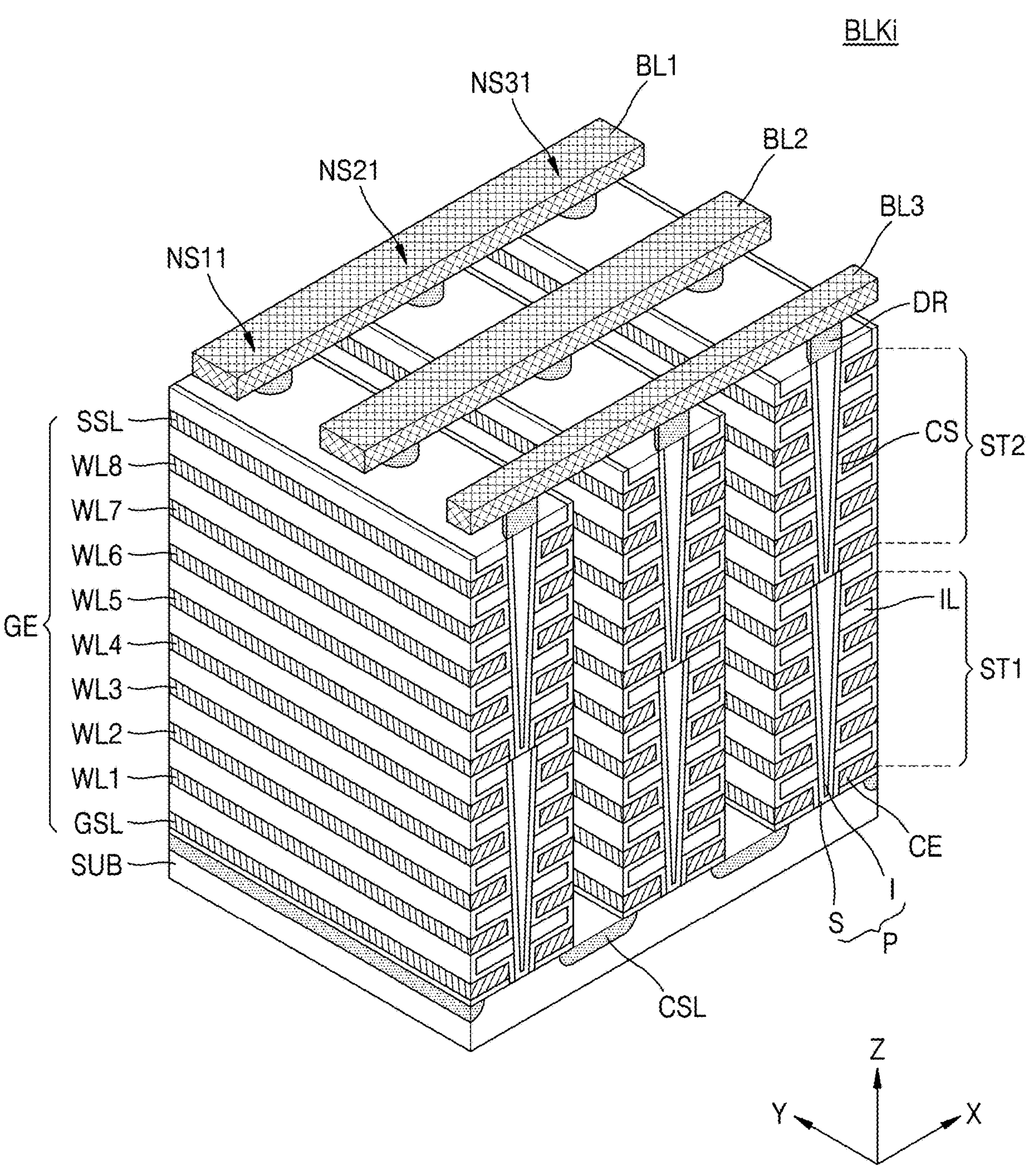
Figure 12:
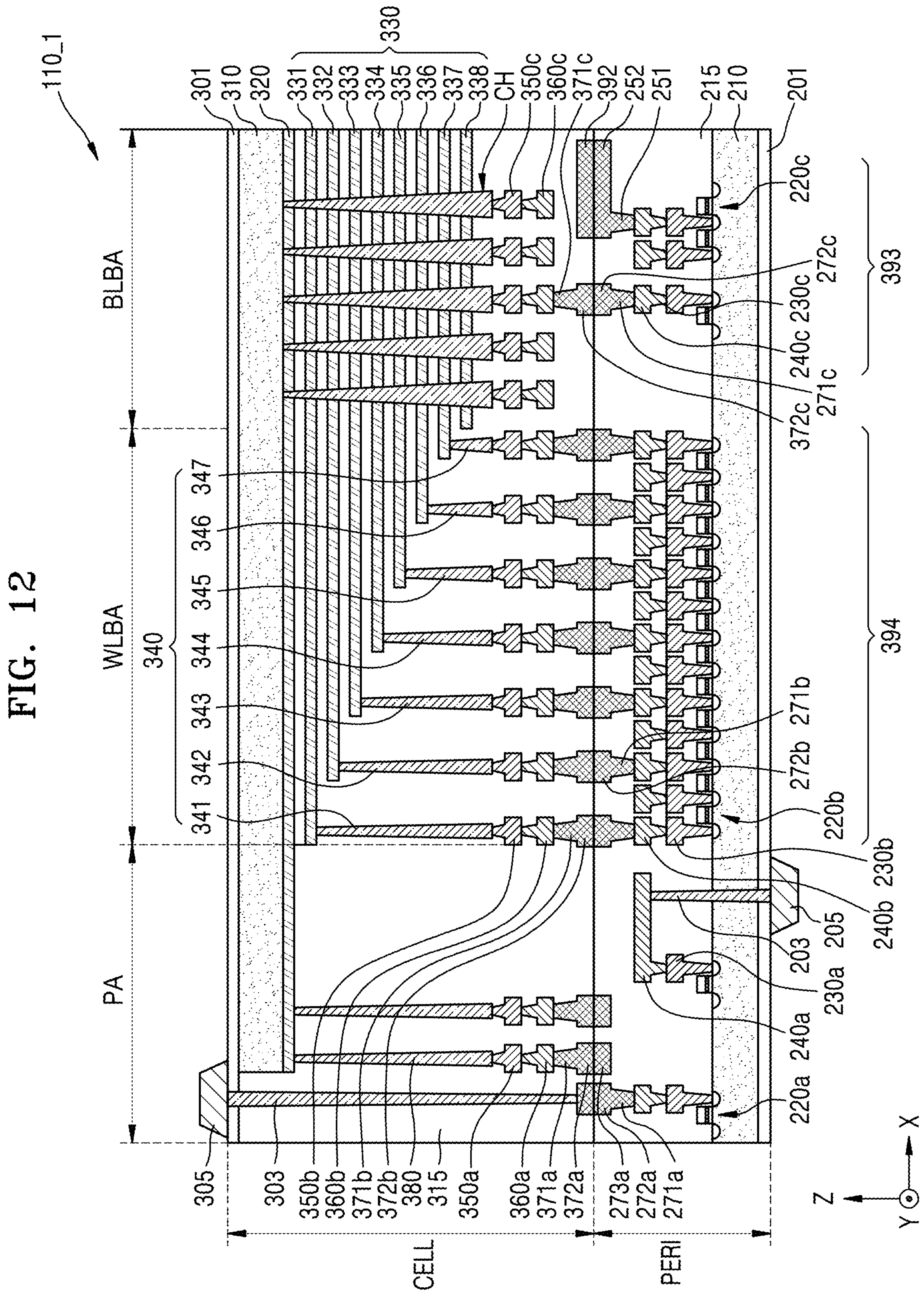

FIGS. 10 to 12 are diagrams for describing a 3D V-NAND structure that may be applied to a memory device according to some embodiments.

A non-volatile memory that may be applied to the memory device 100 (see FIG. 1) may include a plurality of memory blocks. FIGS. 10 and 11 illustrate a structure of one memory block BLKi from among the plurality of memory blocks, and FIG. 13 illustrates an example of a non-volatile memory.

Referring to FIG. 10, the memory block BLKi may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1 to MC8, and a ground selection transistor GST. For brevity of the drawings, FIG. 10 shows that each of the plurality of memory NAND strings NS11 to NS33 includes eight memory cells MC1 to MC8, but one or more embodiments are not limited thereto.

The string selection transistor SST may be connected to a corresponding string selection line SSL1, SSL2, or SSL3. The plurality of memory cells MC1 to MC8 may be connected to corresponding gate lines GTL1 to GTL8, respectively. The gate lines GTL1 to GTL8 may correspond to the word lines, and some of the gate lines GTL1 to GTL8 may correspond to dummy word lines. The ground selection transistor GST may be connected to a corresponding ground selection line GSL1, GSL2, or GSL3. The string selection transistor SST may be connected to a corresponding bit line BL1, BL2, or BL3, and the ground selection transistor GST may be connected to the common source line CSL.

The gate line (e.g., GTL1) at the same height may be commonly connected, and the ground selection lines GSL1, GSL2, and GSL3 and the string selection lines SSL1, SSL2, and SSL3 may be separated. FIG. 10 shows that the memory block BLK is connected to eight gate lines GTL1 to GTL8 and three bit lines BL1, BL2, and BL3, but one or more embodiments are not limited thereto.

Referring to FIG. 11, the memory block BLKi is formed in a direction perpendicular to a substrate SUB. The memory cells forming the memory NAND strings NS11 to NS33 are stacked on a plurality of semiconductor layers.

On the substrate SUB, the common source line CSL stretching in a first direction (Y-direction) is provided. On the region of substrate SUB, between two adjacent common source lines CSL, a plurality of insulating layers IL stretching in the first direction (Y-direction) are sequentially provided in a third direction (Z-direction), and the plurality of insulating layers IL may be spaced apart a certain distance from one another in the third direction (Z-direction). On the region of the substrate SUB between two adjacent common source lines CSL, a plurality of pillars P are sequentially arranged in the first direction (Y-direction) and penetrate through the plurality of insulating layers IL along the third direction (Z-direction). The plurality of pillars P may come into contact with the substrate SUB through the plurality of insulating layers IL. A surface layer S of each pillar P may include a silicon material doped as a first conductive type and may function as a channel region.

An internal layer I in each pillar P may include an insulating material such as silicon oxide or air gap. In a region between adjacent common source lines CSL, a charge storage layer CS is provided along exposed surfaces of the insulating layers IL, the pillars P, and the substrate SUB. The charge storage layer CS may include a gate insulating layer (or referred to as 'tunneling insulating layer'), a charge trap layer, and a blocking insulating layer. Also, in a region between two adjacent common source lines CSL, gate electrodes GE such as selection lines (e.g., GSL, SSL) and the word lines WL1 to WL8 are provided on the exposed surface of the charge storage layer CS. Drains or drain contacts DR may be respectively provided on the plurality of pillars P. The bit lines BL1 to BL3 may be provided on the drain contacts DR and are stretched in the second direction (X-direction) and spaced apart a certain distance from one another in the first direction (Y-direction).

As shown in FIG. 11, each of the memory NAND strings NS11 to NS33 may be implemented as a structure in which a first memory stack ST1 and a second memory stack ST2 are stacked. The first memory stack ST1 is connected to the common source line CSL, the second memory stack ST2 is connected to the bit lines BL1 to BL3, and the first memory stack ST1 and the second memory stack ST2 are stacked so as to share a channel hole with each other.

Further referring to FIG. 12, a non-volatile memory 110_1 may have a chip-to-chip (C2C) structure. The C2C structure may denote that an upper chip including a cell area CELL is manufactured on a first wafer, a lower chip including a peripheral circuit area PERI is manufactured on a second wafer that is different from the first wafer, and the upper chip and the lower chip are connected to each other via bonding. For example, the bonding method may denote a method of electrically connecting bonding metals to each other, the bonding metals being formed on an uppermost metal layer of the upper chip and on an uppermost metal layer of the lower chip. For example, when the bonding metal includes copper (Cu), the bonding method may denote a Cu—Cu bonding method, but the bonding metal may also include aluminum (Al) or tungsten (W).

Each of the peripheral circuit area PERI and the cell area CELL of the non-volatile memory 110_1 may include an external pad bonding region PA, a word line bonding region WLBA, and a bit line bonding region BLBA.

The peripheral circuit area PERI may include a first substrate 210, an interlayer insulating layer 215, a plurality of circuit devices 220*a*, 220*b*, and 220*c* formed on the first substrate 210, first metal layers 230*a*, 230*b*, and 230*c* connected respectively to the plurality of circuit devices 220*a*, 220*b*, and 220*c*, and second metal layers 240*a*, 240*b*, and 240*c* formed on the first metal layers 230*a*, 230*b*, and 230*c*. In an embodiment, the first metal layers 230*a*, 230*b*, and 230*c* may include tungsten having relatively high electrical resistivity, and the second metal layers 240*a*, 240*b*, and 240*c* may include copper having relatively low electrical resistivity.

In the specification, the first metal layers 230*a*, 230*b*, and 230*c* and the second metal layers 240*a*, 240*b*, and 240*c* are only shown, but one or more embodiments are not limited thereto, that is at least one metal layer may be further formed on the second metal layers 240*a*, 240*b*, and 240*c*. At least some of one or more metal layers formed on the second metal layers 240*a*, 240*b*, 240*c* may include aluminum, etc. having lower electrical resistivity than that of the copper included in the second metal layers 240*a*, 240*b*, and 240*c*.

The interlayer insulating layer 215 is disposed on the first substrate 210 so as to cover or overlap the plurality of circuit devices 220*a*, 220*b*, and 220*c*, the first metal layers 230*a*, 230*b*, and 230*c*, and the second metal layers 240*a*, 240*b*, and 240*c*, and may include an insulating material such as silicon oxide, silicon nitride, etc.

Lower bonding metals 271*b* and 272*b* may be formed on the second metal layer 240*b* in the word line bonding region WLBA. In the word line bonding region WLBA, the lower bonding metals 271*b* and 272*b* of the peripheral circuit area PERI may be electrically connected to upper bonding metals 371*b* and 372*b* of the cell area CELL via bonding, and the lower bonding metals 271*b* and 272*b* and the upper bonding metals 371*b* and 372*b* may include aluminum, copper, tungsten, etc.

The cell area CELL may provide at least one memory block. The cell area CELL may include a second substrate 310 and a common source line 320. A plurality of word lines 331-338 (330) may be stacked in a direction (Z-direction) perpendicular to the upper surface of the second substrate 310. String selection lines and ground selection lines may be disposed on and under the word lines 330, and the plurality of word lines 330 may be arranged between the string selection lines and the ground selection line.

In the bit line bonding region BLBA, the channel structure CH may extend in the direction (Z-direction) perpendicular to the upper surface of the second substrate 310 and pass through the word lines 330, the string selection lines, and the ground selection line. The channel structure CH may include a data storage layer, a channel layer, and an embedded insulation layer, and the channel layer may be electrically connected to the first metal layer 350*c* and the second metal layer 360*c*. For example, the first metal layer 350*c* may be a bit line contact and the second metal layer 360*c* may be a bit line. In some embodiments, the bit line may extend in the first direction (Y-direction) that is parallel to the upper surface of the second substrate 310.

A region where the channel structure CH, the second metal layer 360*c*, etc. are arranged may be defined as the bit line bonding region BLBA. The second metal layer 360*c* may be electrically connected to the circuit devices 220*c* providing a page buffer 393 in the peripheral circuit area PERI, from the bit line bonding region BLBA. For example, the second metal layer 360*c* is connected to the upper bonding metals 371*c* and 372*c* in the peripheral circuit area PERI, and the upper bonding metals 371*c* and 372*c* may be connected to the lower bonding metals 271*c* and 272*c* that are connected to the circuit devices 220*c* of the page buffer 393.

In the word line bonding region WLBA, the word lines 330 may extend in the second direction (X-direction) that is perpendicular to the first direction and parallel to the upper surface of the second substrate 310, and may be connected to a plurality of cell contact plugs 341-347 (340). The word lines 330 and the cell contact plugs 340 may be connected to each other on the pads that are provided by at least some of the word lines 330 extending to different directions in the second direction. The first metal layer 350*b* and the second metal layer 360*b* may be sequentially connected to the upper portions of the cell contact plugs 340 that are connected to the word lines 330. The cell contact plugs 340 may be connected to the peripheral circuit area PERI via the upper bonding metals 371*b* and 372*b* of the cell area CELL and the lower bonding metals 271*b* and 272*b* of the peripheral circuit area PERI, in the word line bonding region WLBA.

The cell contact plugs 340 may be electrically connected to the circuit devices 220*b* providing a row decoder 394 in the peripheral circuit area PERI. In some embodiments, operating voltages of the circuit devices 220*b* forming the row decoder 394 may be different from the operating voltages of the circuit devices 220*c* forming the page buffer 393. For example, the operating voltage of the circuit devices 220*c* forming the page buffer 393 may be greater than that of the circuit devices 220*b* forming the row decoder 394.

A common source line contact plug 380 may be arranged in an external pad bonding region PA. The common source line contact plug 380 may include a conductive material such as metal, metal compound, polysilicon, etc., and may be electrically connected to the common source line 320. The first metal layer 350*a* and the second metal layer 360*a* may be sequentially stacked on the common source line contact plug 380. For example, the region where the common source line contact plug 380, the first metal layer 350*a*, and the second metal layer 360*a* are arranged may be defined as the external pad bonding region PA.

In addition, input/output pads 205 and 305 may be arranged in the external pad bonding region PA. A lower insulating layer 201 covering or overlapping a lower surface of the first substrate 210 may be formed on the lower portion of the first substrate 210, and the first input/output pad 205 may be formed on the lower insulating layer 201. The first input/output pad 205 may be connected to at least one of the plurality of circuit devices 220*a*, 220*b*, and 220*c* arranged in the peripheral circuit area PERI via a first input/output contact plug 203, and may be isolated from the first substrate 210 by the lower insulating layer 201. Also, a side insulating layer is arranged between the first input/output contact plug 203 and the first substrate 210 so as to electrically separate the first input/output contact plug 203 from the first substrate 210.

An upper insulating layer 301 covering or overlapping an upper surface of the second substrate 310 may be formed on the upper portion of the second substrate 310, and the second input/output pad 305 may be disposed on the upper insulating layer 301. The second input/output pad 305 may be connected to at least one of the plurality of circuit devices 220*a*, 220*b*, and 220*c* arranged in the peripheral circuit area PERI via the second input/output contact plug 303. In some embodiments, the second input/output pad 305 may be electrically connected to the circuit device 220*a*.

According to some embodiments, the second substrate 310, the common source line 320, etc. may not be arranged in the region where the second input/output contact plug 303 is arranged. Also, the second input/output pad 305 may not overlap the word lines 330 in the third direction (Z-direction). The second input/output contact plug 303 is separated from the second substrate 310 in a direction parallel to the upper surface of the second substrate 310 and may be connected to the second input/output pad 305 through the interlayer insulating layer 315 of the cell area CELL.

According to some embodiments, the first input/output pad 205 and the second input/output pad 305 may be selectively formed. For example, the non-volatile memory 110_1 may only include the first input/output pad 205 disposed on the upper portion of the first substrate 210 or may only include the second input/output pad 305 disposed on the upper portion of the second substrate 310. In some embodiments, the non-volatile memory 110 may include both the first input/output pad 205 and the second input/output pad 305.

In each of the external pad bonding region PA and the bit line bonding region BLBA respectively included in the cell area CELL and the peripheral circuit area PERI, the metal pattern of the uppermost metal layer may exist as a dummy pattern or the uppermost metal layer may be empty.

The non-volatile memory 110_1 may form, in the external pad bonding region PA, the lower metal pattern 273*a* having the same shape as the upper metal pattern 372*a* of the cell area CELL, in the uppermost metal layer of the peripheral circuit area PERI, in correspondence with the upper metal pattern 372*a* formed in the uppermost metal layer of the cell area CELL. The lower metal pattern 273*a* formed in the uppermost metal layer of the peripheral circuit area PERI may not be connected to an additional contact in the peripheral circuit area PERI. Similarly, in the external pad bonding region PA, in correspondence with the lower metal pattern 273*a* formed in the uppermost metal layer of the peripheral circuit area PERI, the upper metal pattern 373*a* having the same shape as that of the lower metal pattern 273*a* of the peripheral circuit area PERI may be formed in the upper metal layer of the cell area CELL.

The lower bonding metals 271*b* and 272*b* may be formed on the second metal layer 240*b* in the word line bonding region WLBA. In the word line bonding region WLBA, the lower bonding metals 271*b* and 272*b* of the peripheral circuit area PERI may be electrically connected to upper bonding metals 371*b* and 372*b* of the cell area CELL via bonding.

Also, in the bit line bonding region BLBA, an upper metal pattern 392 having the same shape as that of a lower metal pattern 252 of the peripheral circuit region PERI may be formed in the uppermost metal layer of the cell area CELL in correspondence with the lower metal pattern 252 formed in the uppermost metal layer of the peripheral circuit area PERI. A contact may not be formed on the upper metal pattern 392 formed in the uppermost metal layer of the cell area CELL.

While the inventive concept has been particularly shown and described with reference to embodiments thereof, it will be understood that various changes in form and details may be made therein without departing from the spirit and scope of the following claims.

What is claimed is:

1. A memory device comprising:

a memory cell array, wherein the memory cell array comprises:

an aggressor word line on which a read operation is performed; and a memory block including a victim word line that is adjacent to the aggressor word line, wherein the memory device is configured to perform a verification operation on the memory cell array based on a pass voltage signal, wherein a change in a read voltage with respect to the memory block is recorded as a recorded change in the read voltage, wherein the memory device is configured to change a pass voltage based on the recorded change in the read voltage, and wherein the memory device is configured to, when a preset number of read operations is exceeded, change the pass voltage based on the recorded change in the read voltage.

2. The memory device of claim 1, wherein the change in the pass voltage includes providing an offset to the pass voltage, and wherein the change in the pass voltage is based on an equation that is predetermined.

3. The memory device of claim 2, wherein the change in the pass voltage is based on a distribution of respective threshold voltages of memory cells included in the memory cell array, and wherein the change in the pass voltage is based on a preset ratio between a maximum value and a minimum value of the distribution of the threshold voltages.

4. The memory device of claim 3, wherein the preset ratio between the minimum value and the maximum value in the distribution of the threshold voltages is 1:0.93.

5. The memory device of claim 1, wherein the change in the pass voltage includes an offset to the pass voltage, and wherein the change in the pass voltage is based on a table value that is predetermined.

6. The memory device of claim 1, wherein the change in the pass voltage includes an offset to the pass voltage, and wherein the change in the pass voltage is determined independently for each of a plurality of word lines included in the memory cell array.

7. The memory device of claim 1, wherein, after a preset time duration, the pass voltage is changed based on the recorded change in the read voltage.

8. An operating method of a memory device configured to perform a verification operation on a memory cell array based on a pass voltage, the operating method comprising:

determining a memory block that is a target of data reading;

recording a change in a read voltage of the memory block as a recorded change in the read voltage;

and changing the pass voltage based on the recorded change in the read voltage, comprising, when a preset number of read operations is exceeded, changing the pass voltage based on the recorded change of the read voltage.

9. The operating method of claim 8, wherein changing the pass voltage comprises offsetting the pass voltage based on an equation that is predetermined.

10. The operating method of claim 9, wherein changing the pass voltage comprises changing the pass voltage based on a preset ratio between a maximum value and a minimum value in distribution of threshold voltages.

11. The operating method of claim 10, wherein the preset ratio between the minimum value and the maximum value in the distribution of the threshold voltages is 1:0.93.

12. The operating method of claim 8, wherein changing the pass voltage comprises offsetting the pass voltage based on a preset table value.

13. The operating method of claim 8, wherein changing the pass voltage comprises offsetting the pass voltage independently for each of a plurality of word lines.

14. The operating method of claim 8, wherein changing the pass voltage comprises:

after a preset time duration has passed, changing the pass voltage based on the recorded change of the read voltage.

15. A memory device comprising:

a memory cell array, wherein the memory cell array comprises:

an aggressor word line on which a read operation is performed; and a memory block including a victim word line that is adjacent to the aggressor word line, and wherein the memory device is configured to perform a verification operation on the memory cell array based on a pass voltage signal, and configured to record a change in a read voltage with respect to the memory block as a recorded change, and wherein the recorded change in the read voltage is a changed read level of at least one memory cell included in the memory block.

16. The memory device of claim 15, wherein the memory device is configured to change a pass voltage based on the recorded change in the read voltage.

17. The memory device of claim 16, wherein the change in the pass voltage includes an offset to the pass voltage and is based on an equation that is predetermined.

* * * * *